US011394365B2

United States Patent
Knapp et al.

(10) Patent No.: US 11,394,365 B2
(45) Date of Patent: Jul. 19, 2022

(54) SAW DEVICE WITH COMPOSITE SUBSTRATE FOR ULTRA HIGH FREQUENCIES

(71) Applicant: RF360 EUROPE GMBH, Munich (DE)

(72) Inventors: Matthias Knapp, Munich (DE); Christian Huck, Munich (DE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/053,768

(22) PCT Filed: Apr. 25, 2019

(86) PCT No.: PCT/EP2019/060636
§ 371 (c)(1),
(2) Date: Nov. 7, 2020

(87) PCT Pub. No.: WO2019/214961
PCT Pub. Date: Nov. 14, 2019

(65) Prior Publication Data
US 2021/0265971 A1     Aug. 26, 2021

(30) Foreign Application Priority Data
May 8, 2018  (DE) ............... 10 2018 111 013.8

(51) Int. Cl.
*H03H 9/02* (2006.01)
*H03H 9/64* (2006.01)

(52) U.S. Cl.
CPC .... *H03H 9/02574* (2013.01); *H03H 9/02582* (2013.01); *H03H 9/02834* (2013.01); *H03H 9/6406* (2013.01)

(58) Field of Classification Search
CPC ........... H03H 9/02574; H03H 9/02582; H03H 9/02834; H03H 9/6406; H03H 9/02866; H03H 9/02559; H03H 9/02566
(Continued)

(56) References Cited

U.S. PATENT DOCUMENTS

2012/0194032 A1   8/2012  Kadota et al.
2015/0028720 A1   1/2015  Kando
(Continued)

FOREIGN PATENT DOCUMENTS

JP   2003107622 A   9/2003
JP   2006046457 A   9/2007

OTHER PUBLICATIONS

International Search Report and Written Opinion dated Jul. 22, 2019 corresponding to Application No. PCT/EP2019/060636.
(Continued)

*Primary Examiner* — Rakesh B Patel
*Assistant Examiner* — Jorge L Salazar, Jr.
(74) *Attorney, Agent, or Firm* — Patterson & Sheridan, LLP

(57) ABSTRACT

A SAW device having a stacked design of functional layers is proposed that is build up on a carrier substrate (SUB) that is chosen to provide a high acoustic velocity. The stack further comprises a thin TCF compensation layer (TCL), a thin film piezoelectric layer (PEL) and a set of interdigital electrodes (IDE) on top of the piezoelectric layer. Energy of the desired mode mainly in the high acoustic velocity material. Despite the high possible operating frequencies the SAW device can reliably be manufactured with present lithographic techniques.

9 Claims, 4 Drawing Sheets

Figure 1:
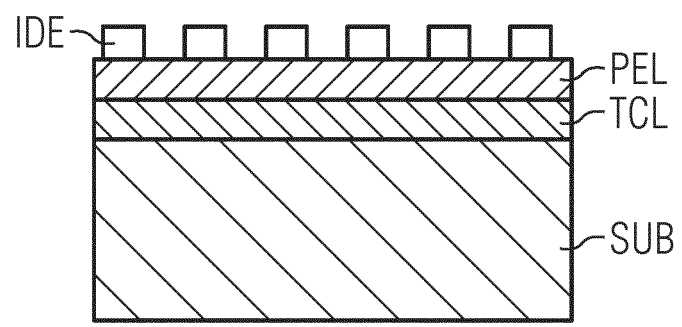

(58) Field of Classification Search
USPC .......................................... 333/133, 193–196
See application file for complete search history.

(56) References Cited

U.S. PATENT DOCUMENTS

2018/0102755 A1    4/2018  Takamine et al.
2019/0165763 A1*   5/2019  Mimura ................. H03H 9/25

OTHER PUBLICATIONS

Italbi A et al, "Theoretical study of Lamb acoustic waves characteristics in a AlN/diamond composite membranes for Super High Frequency range operating devices", Diamond and Related Materials, Elsevier, vol. 22, Oct. 2011 (Oct. 2011), p. 66-69.

* cited by examiner

- ○ LN on sapphire
- ○ LT on sapphire
- — LT bulk reference

- ○ LN on sapphire
- ○ LT on sapphire
- — LT bulk reference

SAW DEVICE WITH COMPOSITE SUBSTRATE FOR ULTRA HIGH FREQUENCIES

CROSS-REFERENCE TO RELATED APPLICATIONS

This application is a national stage application under 35 U.S.C. 371 of PCT/EP2019/060636, filed Apr. 25, 2019, which claims the benefit of German Application No. 10 2018 111 013.8, filed May 8, 2018, both of which are incorporated herein by reference in their entireties.

Today, SAW devices as used in frequency filters for wireless communication devices need to comply with a number of specifications. Newly introduced standards or new developments continuously require the specifications to be adapted and the devices to be improved. Operation of wireless devices in a multiple of bands that may be coupled in a carrier aggregation mode, need a high frequency stability under different temperature conditions and a good suppression of spurious modes out of band. Especially when operating the SAW device under high power level require respective solutions each that often need to be combined in one device.

SAW devices using leaky surface waves show losses due to an undesired radiation of acoustic energy into the bulk substrate. Further, additional bulk modes can reach the electrodes of the transducer and produce a parasitic signal that may be disturbing the operation in the used frequency band. Further losses are due to the excitation of higher modes like plate modes or the second harmonics which is often referred to as H2 mode.

One approach to reduce these losses and to cancel parasitic signals is the use of a piezoelectric film at the surface of a support substrate. In such a layered structure the parasitic bulk mode may be guided within the piezoelectric film itself and not near the top surface of the piezoelectric film where the SAW transducer electrodes are arranged, resulting in unwanted spurious signals.

Further problems arise if further functional layers are introduced into the layered structure of the SAW device, for example a temperature compensation layer to reduce the temperature coefficient of frequency and thus, to improve the temperature stability of the device. A layer that can reduce the temperature coefficient preferably comprises a material having a positive TCF, like silicon dioxide for example. Each further layer in such a multilayer structure enhances the probability that undesired bulk modes or other spurious modes are produced within such a structure.

From published US patent application, US2015/0102705 A1, an elastic surface wave device is known that allows to confine the main mode of the elastic wave within a layer system. This elastic surface wave device includes a high acoustic velocity film, a low acoustic velocity film and a piezoelectric film arranged in that order on the top of a carrier substrate in order to reach the desired object. Nevertheless, the impact of the disclosed layer stack on the excitation and position of additional higher order spurious modes, like plate modes or second harmonics has not been investigated.

The evolution of next generation mobile communication systems require devices with outstanding combination of various performance criteria, e.g. operation at high frequency, high quality factor of the devices, large electromechanical coupling ($k^2$) of piezoelectric material and a low temperature coefficient of frequency (TCF). Currently, typically used SAW devices based on bulk substrates of lithium tantalate (LT), lithium niobate (LN) or quartz are widely used in low and mid band LTE applications, e.g. in the range of 1 GHz up to 2.5 GHz. However, future applications require devices of up to 6 GHz which cannot be supported by conventional SAW devices so far.

It is an object of the present invention to provide a SAW device that is suitable for UHF.

At least one of these objects is met by a SAW device according to claim 1. Improved embodiments that may meet other objectives are given in dependent sub-claims.

A SAW device is proposed that is able to propagate acoustic waves with a velocity that is higher than in commonly used SAW devices or piezoelectric materials. For this purpose a stacked design of functional layers is used build up on a carrier substrate that is chosen to provide the high acoustic velocity. The stack further comprises a TCF compensation layer, a piezoelectric layer and on top of the piezoelectric layer a set of interdigital electrodes adapted to excite an acoustic main mode.

The overall layer stack provides a combination of superior properties, e.g. high velocity, high k2 and low losses.

TCF compensation layer and piezoelectric layer are made thin enough to make the acoustic wave mainly propagate within the "high speed" material of the carrier material. The wave velocity of the carrier substrate is higher than that of a standard Si wafer.

The benefit of the "high speed" carrier substrate and the low layer thickness is that a high amount of the acoustic wave propagates in the high speed material and a high velocity of the acoustic wave is achieved. A higher velocity is accompanied by a longer wavelength. When using suitable materials and a proper stack design the wavelength becomes long enough to be generated by an IDT electrode having a technically reproducible high pitch even at ultra high operating frequencies of about 6 GHz. Despite the high possible operating frequencies the SAW device can reliably be manufactured with present lithographic techniques.

Such a SAW device can be build up with an outstanding performance, e.g. high velocity, high electromechanical coupling coefficient k2 and high quality factor Q. A surprising further benefit arises from using only a limited number of layers particularly realized by thin films is that excitation of bulk waves can completely be avoided.

The carrier substrate comprises at least a layer of the high-velocity material that is thick enough to allow propagate a major part of the wave within that material. A proper thickness is hence chosen at 3λ or more where λ is the wavelength in this material. Preferably, the carrier substrate is completely consisting of this material.

A preferred carrier substrate material is a material having a wave velocity of the acoustic wave greater than that of a standard Si wafer. Such a material can be chosen from the group consisting of sapphire, graphene, diamond, SiC, polycrystalline silicon, diamond like carbon and AlN.

According to an embodiment, the material of the TCF compensation layer is selected from the group consisting of $SiO_2$, doped $SiO_2$, $GeO_2$, ScYF $ZrW_2O_8$, $ZrMo_2O_8$, $HfMo_2O_8$, $ScW_3O_{12}$, $AlW_3O_{12}$, $Zr(WO_4)(PO_4)_2$, Zeolithe and $B_2O_3$. These materials all show a positive TCF that can counteract the negative TCF of the used piezoelectric material. Moreover they mostly show a negative coefficient of thermal expansion which is especially true for materials selected from transition metal compounds and compounds of rare earth metals. Surprisingly such materials show a high positive temperature coefficient of their E-modulus that is an enhanced stiffness at higher temperatures.

Another material useful for forming the TCF compensation layer is a glass based on $ScF_3$. This material has a sufficient hardness, is sufficiently mechanically stable and can easily be deposited.

An extra large temperature coefficient of its E-modulus provides $ScF_3$ doped with Yttrium having a general formula of $Sc_{(1-x)}Y_xF_3$ where x is set to obey the relation $0<x\leq0.25$.

The index x providing the amount of Y is dependent on the solubility of $YF_3$ in $ScF_3$ and can be higher in an appropriate material. Most beneficial is an amount x of about 0.2. Then, temperature coefficient of its E-modulus reaches a high value of about 1500 ppm/K which is about five times that of $SiO_2$.

According to a further embodiment the temperature compensation layer comprises an oxidic network forming material. These show a negative coefficient of thermal expansion and a normal thermomechanical behavior accompanied by a positive temperature coefficient of stiffness and E-modulus. Examples are $ZrW_2O_8$, $ZrMo_2O_8$, $HfMo_2O_8$, $ScW_3O_{12}$, $AlW_3O_{12}$, $Zr(WO_4)(PO_4)_2$ as well as many Zeolithe and $B_2O_3$.

Further compounds having the above described properties are non-oxidic network forming fluorine-based compounds like $ScF_3$—$BaF2$-$YF3$, $ScF_3$—$BaF_2$—$ZnF_2$, $ScF_3$—$BaF_2$—$InF_3$, $ScF_3$—$MgF_2$, $YbF_3$—$ScF_3$, $LuF_3$—$ScF_3$, $Zn(CN)_2$ and $BeF_2$ as well as some Cyanides like e.g. $Zn(CN)_2$.

The SAW device preferably has an IDT electrode structure that form at least one SAW resonator operating at a frequency band above 2.5 GHz.

In a more specified embodiment the carrier substrate is a bulk material chosen from sapphire, graphene, diamond, SiC, polycrystalline silicon, diamond like carbon and AlN. Thereupon a dielectric TCF compensating layer is arranged having a positive temperature coefficient of frequency. This layer is formed of silicon dioxide ($SiO_2$), doped $SiO_2$, germanium dioxide ($GeO_2$), scandium fluoride ($ScF_3$), yttrium fluoride ($YF_3$), zirconium tungstate ($ZrW_2O_8$), zirconium molybdate ($ZrMo_2O_8$), hafnium molybdate ($HfMo_2O_8$), $ScW_3O_{12}$, $AlW_3O_{12}$, zirconium tungsten phosphate ($Zr(WO_4)(PO_4)_2$). Zeolithe or boric oxide ($B_2O_3$). The thickness thereof is about 5 nm to 200 nm. A thin film piezoelectric layer is arranged on the top of the TCF compensating layer and is chosen from high coupling piezoelectric material like lithium tantalate and lithium niobate with a suitable cut angle. The piezoelectric layer has a thickness of 5 nm to 300 nm. An IDT electrode structure arranged on the top of the piezoelectric layer forms a resonator operating at an operating frequency between 3 GHz and 8 GHz.

The SAW device can be part of a filter circuit wherein the filter circuit comprises a SAW filter, a duplexer or a multiplexer.

In the following the invention is explained in more detail with regard to specific embodiments and the accompanying figures. In the figures, some details may be depicted enlarged for better understanding and thus, the figures are not drawn to scale.

Figure 2A:
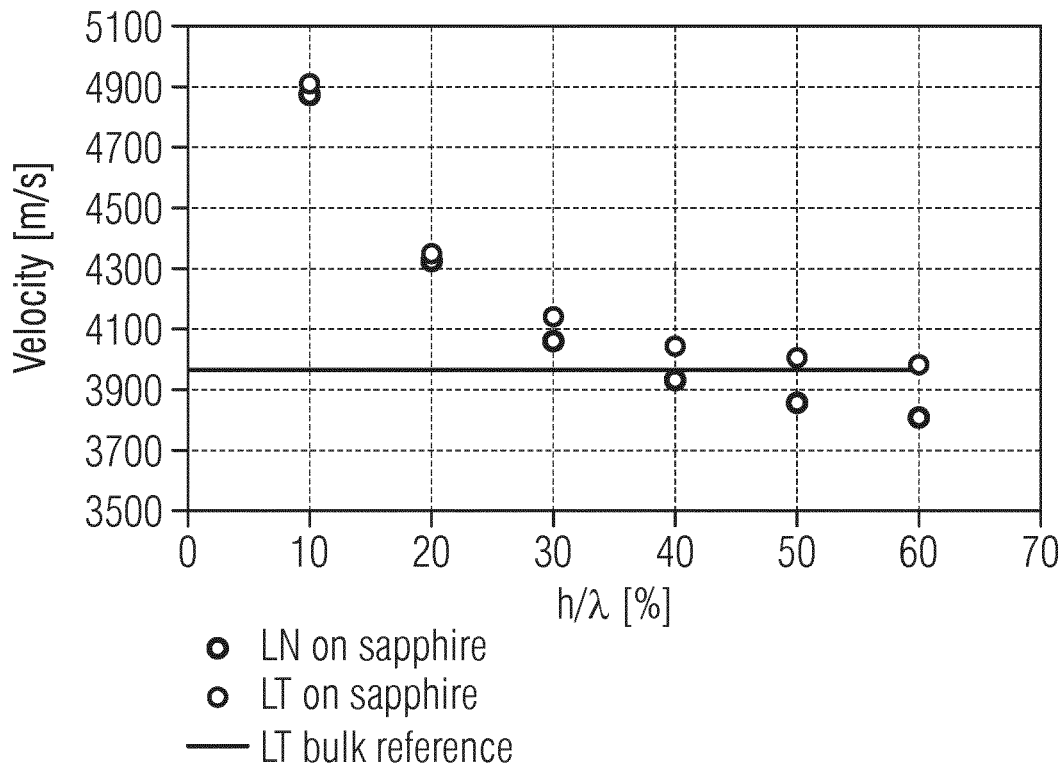
Figure 2B:
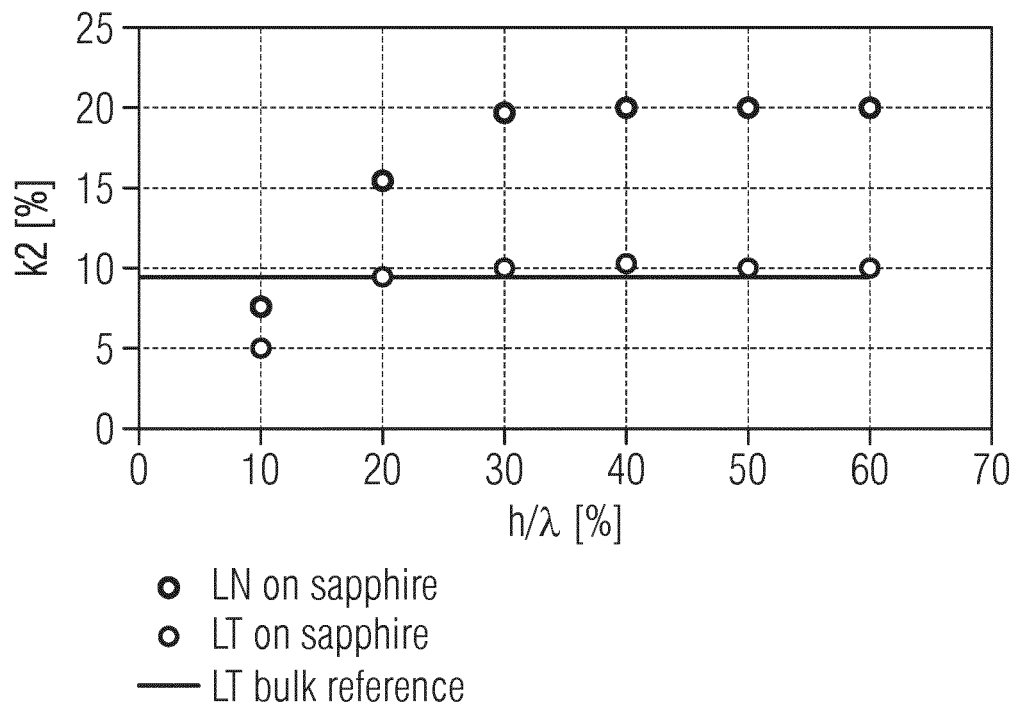
Figure 3:
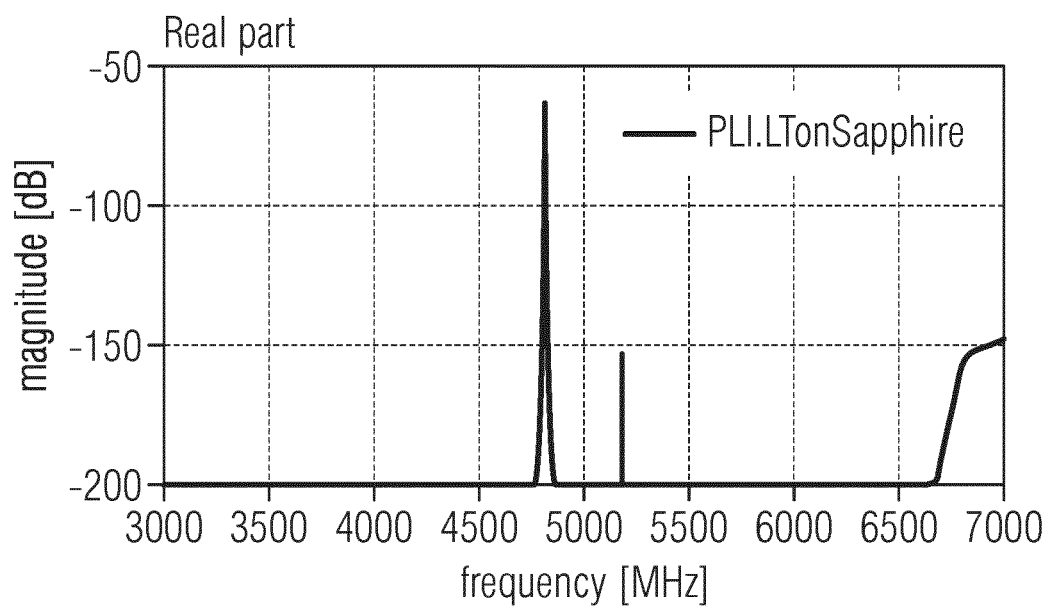
Figure 3:
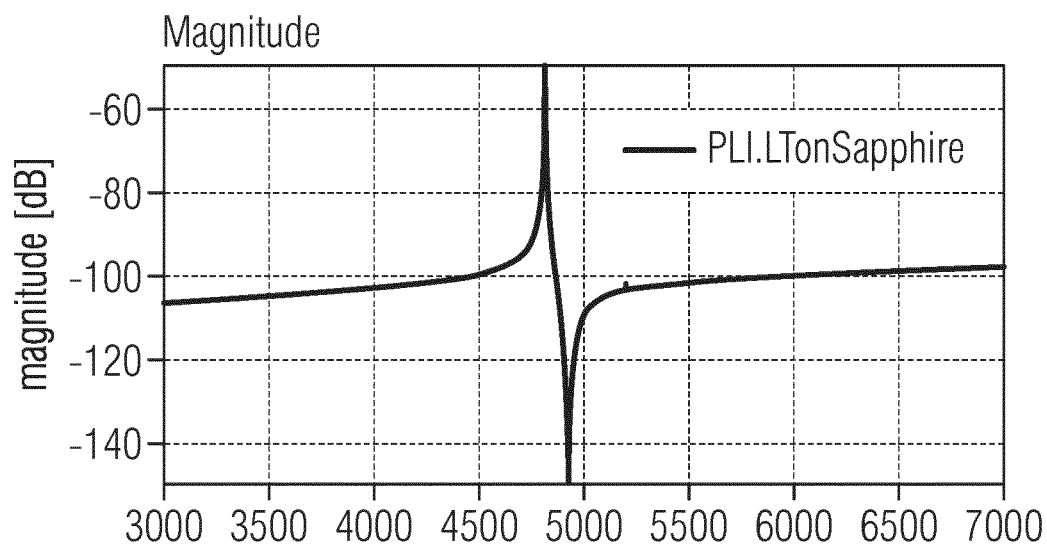
Figure 4:
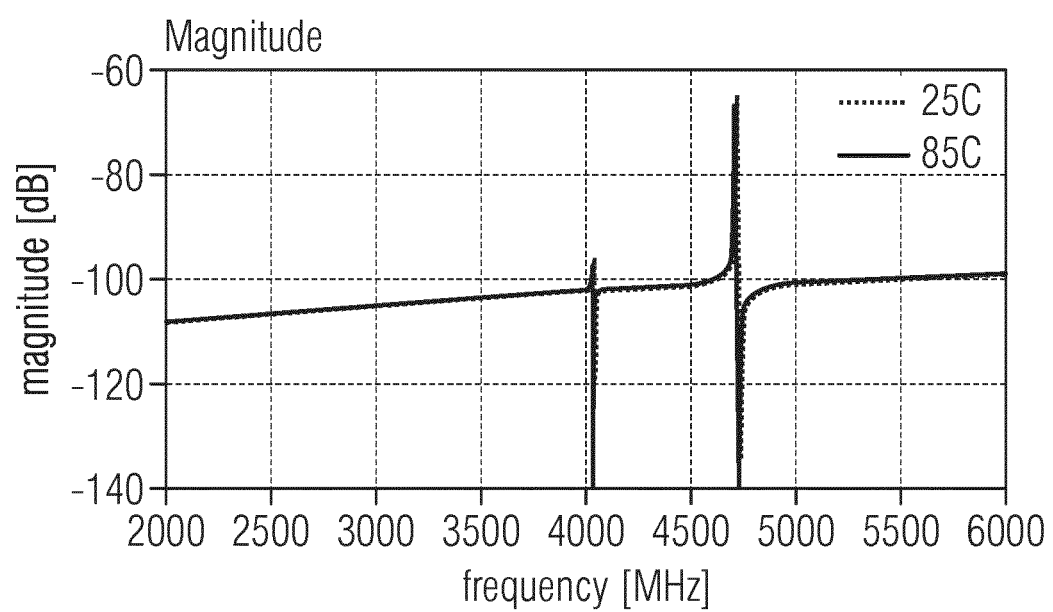

FIG. 1 shows a stacked design of a SAW device according to the invention in a schematic cross-section, FIG. 2a shows a dependency of frequency on piezoelectric thin film thickness using a SAW resonator according to the invention, FIG. 2b shows a dependency of k2 on piezoelectric thin film thickness using a SAW resonator according to the invention, FIG. 3 shows the absolute value and real part of the admittance of a SAW resonator according to the invention, FIG. 4 shows an embodiment similar to that of FIG. 3 but including a TCL layer for different ambient temperatures according to the invention.

FIG. 1 shows a stacked design of a SAW device according to the invention in a schematic cross-section. A carrier substrate SUB comprises a material having a high acoustic velocity. The thickness is sufficient to be mechanically stable for further processing and operation of the SAW device. A thin TCF compensating layer TCL is applied on the substrate and has a positive TCF suitable to compensate for the negative TCF of other materials in the stack.

The next layer is a thin film piezoelectric layer PEL which needs to provide appropriate wave excitation and shows a suitably high electromechanical coupling. On top interdigital electrodes IDE are arranged comprising a metallization that is suitable to provide the SAW device function that is to excite a SAW and to recover an electric signal therefrom. Preferably the interdigital electrodes IDE form a resonator. A multiple of resonators can form a filter of a ladder type or lattice type arrangement. However, the interdigital electrodes IDE may realize another SAW device e.g. a DMS filter, a duplexer or a multiplexer.

According to a more specified embodiment a SAW resonator is formed having a piezoelectric thin film using LiTaO3 or LiNbO3 on top of a carrier substrate using sapphire. Aluminum based electrodes are used for SAW excitation.

FIGS. 2a and 2b show the dependency of frequency (FIGS. 2a) and k2 (FIG. 2b) on thickness of thin film LiTaO3 and thin film LiNbO3 compared to a resonator having a LiTaO3 bulk material. Usage of piezoelectric film using thin relative thicknesses provides increased velocities compared to LiTaO3 bulk material. This can be combined with an increased k2 by choosing the appropriate material and piezoelectric thin film thickness.

According to a more specified embodiment a SAW resonator is formed having the following features and dimensions: a carrier substrate SUB of sapphire having a specified cut, a thin piezoelectric layer PEL of LiTaO3 having a thickness of about 5 nm-300 nm and a specified cut.

IDT electrode structures IDE are made of Al and/or copper and form a one-port resonator with a resonance frequency of about 5 GHz.

A simulation of the real part and the absolute value of the admittance of this embodiment is shown in FIG. 3. This SAW device shows a high $k^2$ and has low losses due to the wave guiding of the layer stack suitable for high frequency application as realized with the present embodiment. A Rayleigh type spurious mode is visible above the main resonance at 5 GHz. Further optimization of this raw design will surely suppress this spurious excitation.

Apart from this spurious signal, no additional spurious mode is excited and no further spurious signal is visible in a wide frequency range. This is beneficial for possible sophisticated SAW solutions like carrier aggregation.

The embodiment is further extended by a TCF compensating layer TCL of about 5 nm-200 nm $SiO_2$. A SAW device with improved temperature stability of operating frequency is achieved. FIG. 4 shows the absolute value of the admittance of this embodiment in a narrow band depiction for two different ambient temperatures.

Despite the restricted number of described embodiments the scope of the invention is not limited to the embodiments of figures. Deviations from the proposed materials and dimensions are conceivable and are lying within the skills of an experienced expert. Possible deviations that are within the scope of the invention are solely defined by the claims where claim 1 provides the broadest scope.

We claim:

1. A surface acoustic wave (SAW) device, comprising
   a carrier substrate;
   a dielectric temperature coefficient of frequency (TCF) compensating layer having a positive temperature coefficient of frequency arranged on the carrier substrate;
   a thin film piezoelectric layer arranged on the dielectric TCF compensating layer; and
   an interdigital transducer (IDT) electrode structure arranged on the thin film piezoelectric layer, wherein:
   the carrier substrate comprises a thick layer or a bulk material, and
   the IDT electrode has an operating frequency band above 2.5 GHz.

2. The SAW device of the claim 1,
   wherein a wave velocity of the carrier substrate is higher than that of a standard silicon (Si) wafer.

3. The SAW device of claim 1, wherein the TCF compensation layer comprises one or more of:
   silicon dioxide ($SiO_2$), doped $SiO_2$, germanium dioxide ($GeO_2$), scandium fluoride ($ScF_3$), yttrium fluoride ($YF_3$), zirconium tungstate ($ZrW_2O_8$), zirconium molybdate ($ZrMo_2O_8$), hafnium molybdate ($HfMo_2O_8$), $ScW_3O_{12}$, $AlW_3O_{12}$, zirconium tungsten phosphate ($Zr(WO_4)(PO_4)_2$), Zeolithe or boric oxide ($B_2O_3$).

4. The SAW device of claim 1,
   wherein the carrier substrate is selected from a material having a wave velocity of an acoustic wave greater than that of a standard silicon (Si) wafer,
   wherein the material comprises at least one of sapphire, graphene, diamond, silicon carbide (SiC), polycrystalline silicon, diamond like carbon, or aluminum nitride (AlN).

5. The SAW device of claim 1, wherein the thin film piezoelectric layer comprises at least one of lithium tantalate (LT) or lithium niobate (LN).

6. The SAW device of claim 1,
   wherein the thin film piezoelectric layer has a thickness between about 5 nanometers (nm) to 300 nm.

7. The SAW device of claim 1, wherein the TCF compensating layer has a thickness between about 5 nanometers (nm) to 200 nm.

8. The SAW device of claim 1, wherein:
   the carrier substrate comprises the bulk material including at least one of sapphire, graphene, diamond, SiC, polycrystalline silicon, diamond like carbon, or AlN;
   the dielectric TCF compensating layer has the positive temperature coefficient of frequency arranged on the carrier substrate and comprises at least one of silicon dioxide ($SiO_2$), doped $SiO_2$, germanium dioxide ($GeO_2$), scandium fluoride ($ScF_3$), yttrium fluoride ($YF_3$) zirconium tungstate ($ZrW_2O_8$), zirconium molybdate ($ZrMo_2O_8$), hafnium molybdate ($HfMo_2O_8$), $ScW_3O_{12}$, $AlW_3O_{12}$, zirconium tungsten phosphate ($Zr(WO_4)(PO_4)_2$), Zeolithe or boric oxide ($B_2O_3$), the TCF compensating layer having a thickness of 5 nanometers (nm) to 200 nm;
   the thin film piezoelectric layer arranged on the TCF compensating layer comprises at least one of lithium tantalate or lithium niobate, the thin film piezoelectric layer having a thickness of 5 nm to 300 nm; and
   the IDT electrode structure arranged on the piezoelectric layer comprises a resonator operating at an operating frequency between 3 GHz and 8 GHz.

9. A filter circuit comprising the SAW device of claim 1, embodied as SAW filter, a duplexer or a multiplexer.

* * * * *